US012099676B2

(12) United States Patent
Yang

(10) Patent No.: US 12,099,676 B2
(45) Date of Patent: Sep. 24, 2024

(54) TOUCH DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Weiwei Yang, Wuhan (CN)

( * ) Notice: Subject to any disclaimer, the term of this patent is extended or adjusted under 35 U.S.C. 154(b) by 0 days.

(21) Appl. No.: 17/431,192

(22) PCT Filed: Jul. 16, 2021

(86) PCT No.: PCT/CN2021/106663
§ 371 (c)(1),
(2) Date: Aug. 16, 2021

(87) PCT Pub. No.: WO2022/262047
PCT Pub. Date: Dec. 22, 2022

(65) Prior Publication Data
US 2024/0019960 A1 Jan. 18, 2024

(30) Foreign Application Priority Data

Jun. 17, 2021 (CN) .......................... 202110670700.1

(51) Int. Cl.
G06F 3/041 (2006.01)
H10K 59/40 (2023.01)
G06F 3/044 (2006.01)
(52) U.S. Cl.
CPC ......... *G06F 3/04164* (2019.05); *H10K 59/40* (2023.02); *G06F 3/0443* (2019.05); *G06F 3/0446* (2019.05)

(58) Field of Classification Search
CPC .. G06F 3/04164; G06F 3/0446; G06F 3/0443; H10K 59/40
See application file for complete search history.

(56) References Cited

U.S. PATENT DOCUMENTS

| 2018/0341354 A1 | 11/2018 | Guo et al. | |
| 2019/0235294 A1* | 8/2019 | Wang | G06F 3/0443 |
| 2022/0035487 A1* | 2/2022 | Wang | G06F 3/0412 |

FOREIGN PATENT DOCUMENTS

| CN | 104951170 A | 9/2015 |
| CN | 107301001 A | 10/2017 |
| CN | 107329617 A | 11/2017 |
| CN | 107491213 A | 12/2017 |
| CN | 108490708 A | 9/2018 |
| CN | 110658946 A | 1/2020 |
| CN | 111665999 A | 9/2020 |
| CN | 112684945 A | 4/2021 |
| CN | 112764284 A | 5/2021 |

* cited by examiner

Primary Examiner — Robert J Michaud

(57) ABSTRACT

A touch display panel includes a signal transmission wiring layer including a plurality of signal transmission lines arranged in a first direction, and a touch electrode wiring layer disposed on a side of the signal transmission wiring layer and including a plurality of touch units. Each of the signal transmission lines extends in a second direction. An orthographic projection of a portion of each of the signal transmission lines corresponding to one of the touch units on the touch electrode wiring layer partially overlaps the corresponding touch unit.

18 Claims, 11 Drawing Sheets

TOUCH DISPLAY PANEL

FIELD OF INVENTION

The present disclosure relates to the technical field of display, and particularly to a touch display panel.

BACKGROUND

Organic light emitting diodes (OLEDs) have advantages of light weight, self-luminescence, wide viewing angle, low driving voltage, high luminous efficiency, low power consumption, and fast response time, so that their applications are becoming more widespread. In a current OLED touch display panel, a touch circuit is directly deposited on an encapsulation layer to replace an external touch screen, thereby saving costs.

However, a current encapsulation layer is thick and has many particles, and signal transmission lines of a self-capacitive touch circuit are located under touch units, so that the signal transmission lines and the touch units at the particles are easily short-circuited, resulting in abnormal touch.

SUMMARY OF DISCLOSURE

The present disclosure provides a touch display panel, which can prevent abnormal touch caused by a short circuit between signal transmission lines and touch units.

In a first aspect, the present disclosure provides a touch display panel comprising:
  a signal transmission wiring layer comprising a plurality of signal transmission lines arranged in a first direction, wherein each of the signal transmission lines extends in a second direction; and
  a touch electrode wiring layer disposed on a side of the signal transmission wiring layer and comprising a plurality of touch units arranged in an array, wherein an orthographic projection of a portion of each of the signal transmission lines corresponding to one of the touch units on the touch electrode wiring layer partially overlaps the corresponding touch unit.

In an embodiment, the touch units comprise a plurality of touch unit lines arranged in the first direction. Two adjacent touch unit lines are electrically connected by a touch connection line. Each of the signal transmission lines is disposed between the two adjacent touch unit lines and partially overlaps the touch connection line between the two adjacent touch unit lines.

In an embodiment, the touch display panel further comprises a plurality of sub-pixels arranged in an array. Each of the signal transmission lines comprises a plurality of signal transmission sub-lines that are electrically connected to each other. Each of the signal transmission sub-lines is arranged around one of the sub-pixels.

In an embodiment, each of the sub-pixels comprises a first end and a second end arranged oppositely with respect to the first direction, and a third end and a fourth end arranged oppositely with respect to the second direction. Each of the touch connection lines comprises a first touch connection sub-line arranged along a direction from the first end to the third end, and a second touch connection sub-line arranged along a direction from the third end to the second end. One end of the first touch connection sub-line is connected to the touch unit line disposed on one side of the touch connection line. The other end of the first touch connection sub-line is connected to one end of the second touch connection sub-line. The other end of the second touch connection sub-line is connected to the touch unit line disposed on the other side of the touch connection line.

In an embodiment, each of the touch connection lines further comprises a third touch connection sub-line arranged along a direction from the first end to the fourth end.

In an embodiment, each of the touch connection lines further comprises a fourth touch connection sub-line arranged along a direction from the fourth end to the second end.

In an embodiment, each of the touch connection lines further comprises a third touch connection sub-line arranged along a direction from the first end to the fourth end, and a fourth touch connection sub-line arranged along a direction from the fourth end to the second end.

In an embodiment, the touch display panel further comprises a plurality of sub-pixels arranged in an array. Each of the signal transmission lines comprises a plurality of signal transmission sub-lines that are electrically connected to each other. Each of the signal transmission sub-lines is partially arranged around one of the sub-pixels.

In an embodiment, each of the sub-pixels comprises a first end and a second end arranged oppositely with respect to the first direction, and a third end and a fourth end arranged oppositely with respect to the second direction. Each of the touch connection lines comprises a first touch connection sub-line arranged along the direction from the first end to the third end, and a second touch connection sub-line arranged along a direction from the third end to the second end. One end of the first touch connection sub-line is connected to the touch unit line disposed on one side of the touch connection line. The other end of the first touch connection sub-line is connected to one end of the second touch connection sub-line. The other end of the second touch connection sub-line is connected to the touch unit line disposed on the other side of the touch connection line. The touch connection lines partially overlap with the signal transmission sub-lines.

In an embodiment, each of the signal transmission sub-lines comprises a first signal transmission sub-line arranged along the direction from the first end to the third end, and a second signal transmission sub-line arranged along a direction from the first end to the fourth end. Each of the touch connection lines further comprises a fourth touch connection sub-line arranged along a direction from the fourth end to the second end.

In an embodiment, the touch units further comprise a plurality of dummy sub-lines arranged between adjacent touch unit lines. One end of each of the dummy sub-lines is electrically connected to one of the touch unit lines, and the other end of each of the dummy sub-lines is disposed close to one of the signal transmission lines. The dummy sub-lines do not overlap with the signal transmission lines.

In an embodiment, each of the sub-pixels comprises a first end and a second end arranged oppositely with respect to the first direction, and a third end and a fourth end arranged oppositely with respect to the second direction. Each of the signal transmission sub-lines comprises a first signal transmission sub-line arranged along the direction from the first end to the third end, and a second signal transmission sub-line arranged along a direction from the first end to the fourth end. Each of the dummy sub-lines comprises a first dummy sub-line arranged along a direction from the second end to the third end, and a second dummy sub-line arranged along a direction from the second end to the fourth end.

In a second aspect, the present disclosure provides a touch display panel comprising:

a signal transmission wiring layer comprising a plurality of signal transmission lines arranged in a first direction, wherein each of the signal transmission lines extends in a second direction; and a touch electrode wiring layer disposed on a side of the signal transmission wiring layer and comprising a plurality of touch units arranged in an array, wherein an orthographic projection of a portion of each of the signal transmission lines corresponding to one of the touch units on the touch electrode wiring layer partially overlaps the corresponding touch unit, and in the second direction, each of the signal transmission lines is electrically connected to one of the touch units and is insulated from the other touch units.

In an embodiment, the touch units comprise a plurality of touch unit lines arranged in the first direction. Two adjacent touch unit lines are electrically connected by a touch connection line. Each of the signal transmission lines is disposed between the two adjacent touch unit lines and partially overlaps the touch connection line between the two adjacent touch unit lines.

In an embodiment, the touch display panel further comprises a plurality of sub-pixels arranged in an array. Each of the signal transmission lines comprises a plurality of signal transmission sub-lines that are electrically connected to each other. Each of the signal transmission sub-lines is arranged around one of the sub-pixels.

In an embodiment, each of the sub-pixels comprises a first end and a second end arranged oppositely with respect to the first direction, and a third end and a fourth end arranged oppositely with respect to the second direction. Each of the touch connection lines comprises a first touch connection sub-line arranged along a direction from the first end to the third end, and a second touch connection sub-line arranged along a direction from the third end to the second end. One end of the first touch connection sub-line is connected to the touch unit line disposed on one side of the touch connection line. The other end of the first touch connection sub-line is connected to one end of the second touch connection sub-line. The other end of the second touch connection sub-line is connected to the touch unit line disposed on the other side of the touch connection line.

In an embodiment, each of the touch connection lines further comprises a third touch connection sub-line arranged along a direction from the first end to the fourth end.

In an embodiment, the touch display panel further comprises a plurality of sub-pixels arranged in an array. Each of the signal transmission lines comprises a plurality of signal transmission sub-lines that are electrically connected to each other. Each of the signal transmission sub-lines is partially arranged around one of the sub-pixels.

In an embodiment, each of the sub-pixels comprises a first end and a second end arranged oppositely with respect to the first direction, and a third end and a fourth end arranged oppositely with respect to the second direction. Each of the touch connection lines comprises a first touch connection sub-line arranged along the direction from the first end to the third end, and a second touch connection sub-line arranged along a direction from the third end to the second end. One end of the first touch connection sub-line is connected to the touch unit line disposed on one side of the touch connection line. The other end of the first touch connection sub-line is connected to one end of the second touch connection sub-line. The other end of the second touch connection sub-line is connected to the touch unit line disposed on the other side of the touch connection line. The touch connection lines partially overlap with the signal transmission sub-lines.

In an embodiment, each of the signal transmission sub-lines comprises a first signal transmission sub-line arranged along the direction from the first end to the third end, and a second signal transmission sub-line arranged along a direction from the first end to the fourth end. Each of the touch connection lines further comprises a fourth touch connection sub-line arranged along a direction from the fourth end to the second end. Each of the signal transmission sub-lines comprises a first signal transmission sub-line arranged along the direction from the first end to the third end, and a second signal transmission sub-line arranged along a direction from the first end to the fourth end. Each of the dummy sub-lines comprises a first dummy sub-line arranged along a direction from the second end to the third end, and a second dummy sub-line arranged along a direction from the second end to the fourth end.

In the touch display panel provided by the present disclosure, the orthographic projection of the portion of each of the signal transmission lines corresponding to one of the touch units on the touch electrode wiring layer partially overlaps the corresponding touch unit, so that an area of the signal transmission lines directly facing the touch units is reduced. This prevents abnormal touch caused by a short circuit between the signal transmission lines and the touch units due to particles.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure.

Figure 1:
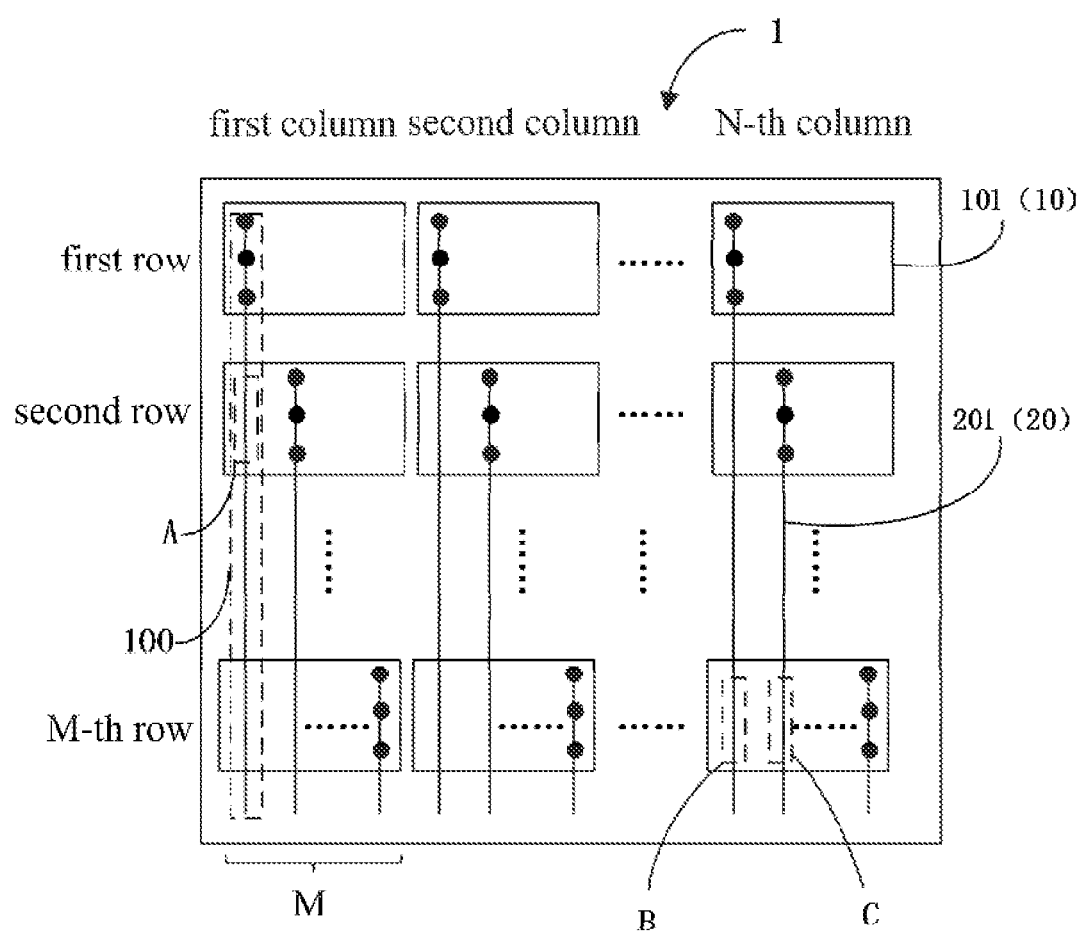
FIG. 1 is a schematic top view structural diagram of a touch display panel according to an embodiment of the present disclosure.

Please refer to FIG. 1, which is a schematic top view structural diagram of a touch display panel 1 according to an embodiment of the present disclosure. As shown in FIG. 1, the touch display panel 1 provided by the embodiment of the present disclosure comprises a touch electrode wiring layer 10 and a signal transmission wiring layer 20. It should be noted that, in the embodiment shown in FIG. 1, the touch electrode wiring layer 10 is disposed on the signal transmission wiring layer 20. In some embodiments, the signal transmission wiring layer 20 may also be disposed on the touch electrode wiring layer 10. That is, the touch electrode wiring layer 10 is disposed on a side of the signal transmission wiring layer 20.

The touch electrode wiring layer 10 comprises a plurality of touch units 101 arranged in an array. The signal transmission wiring layer 20 comprises a plurality of signal transmission lines 201 extending in a column direction. In an extending direction of the signal transmission lines 201, each of the signal transmission lines 201 is electrically connected to one of the touch units 101 and is insulated from the other touch units 101. It should be noted that, in the embodiments of the present disclosure, the column direction is parallel to an extending direction of data signal lines, and a row direction is parallel to an extending direction of scan signal lines. An orthographic projection of a portion of each of the signal transmission lines 201 corresponding to one of the touch units 101 on the touch electrode wiring layer 10 partially overlaps a corresponding touch unit 101.

Specifically, the touch electrode wiring layer 10 comprises M rows of touch units 101 arranged in the column direction and N columns of touch units 101 arranged in the row direction. The signal transmission wiring layer 20 comprises MXN signal transmission lines 201 extending in the column direction. Each column of touch units 101 has M signal transmission lines 201. In a first column of touch units 101, a first signal transmission line 201 corresponds to the touch unit 101 in a first row to the touch unit 101 in an M-th row, and the first signal transmission line 201 is electrically connected to the touch unit 101 in the first row and is insulated from the other touch units 101. In the first column of touch units 101, a second signal transmission line 201 corresponds to the touch unit 101 in a second row to the touch unit 101 in the M-th row, and the second signal transmission line 201 is electrically connected to the touch unit 101 in the second row and is insulated from the other touch units 101. Similarly, in a first column of touch units 101, an M-th signal transmission line 201 corresponds to the touch unit 101 in the M-th row, and the M-th signal transmission line 201 is electrically connected to the touch unit 101 in the M-th row.

It should be understood that among the M signal transmission lines 201 under the touch units 101 in a same column, each of the signal transmission lines 201 is electrically connected to the touch unit 101 in one of the rows, so that a touch signal of the touch unit 101 in each of the rows is independently conducted.

It should be noted that the touch display panel 1 provided by the embodiment of the present disclosure has a plurality of areas that are same as the area A, such as an area B and an area C shown in FIG. 1, which will not be described in detail herein.

Figure 2:
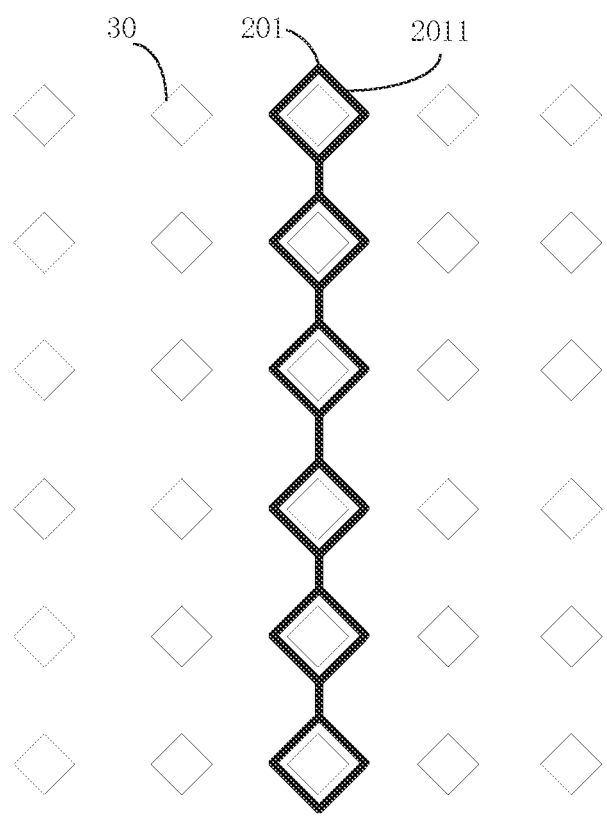
FIG. 2 is an enlarged schematic diagram of signal transmission lines and sub-pixels in an area A in FIG. 1.

Please refer to FIG. 2, which is an enlarged schematic diagram of the signal transmission lines 201 and sub-pixels 30 in the area A in FIG. 1.

As shown in FIG. 2, the signal transmission lines 201 comprise a plurality of signal transmission sub-lines 2011 that are electrically connected to each other. The signal transmission sub-lines 2011 are arranged as grids. The signal transmission sub-lines 2011 are arranged between sub-pixels 30. Each of the signal transmission lines 201 comprises the signal transmission sub-lines 2011 between the sub-pixels 30. That is, each of the signal transmission sub-lines 2011 is arranged around one of the sub-pixels 30.

Figure 3:
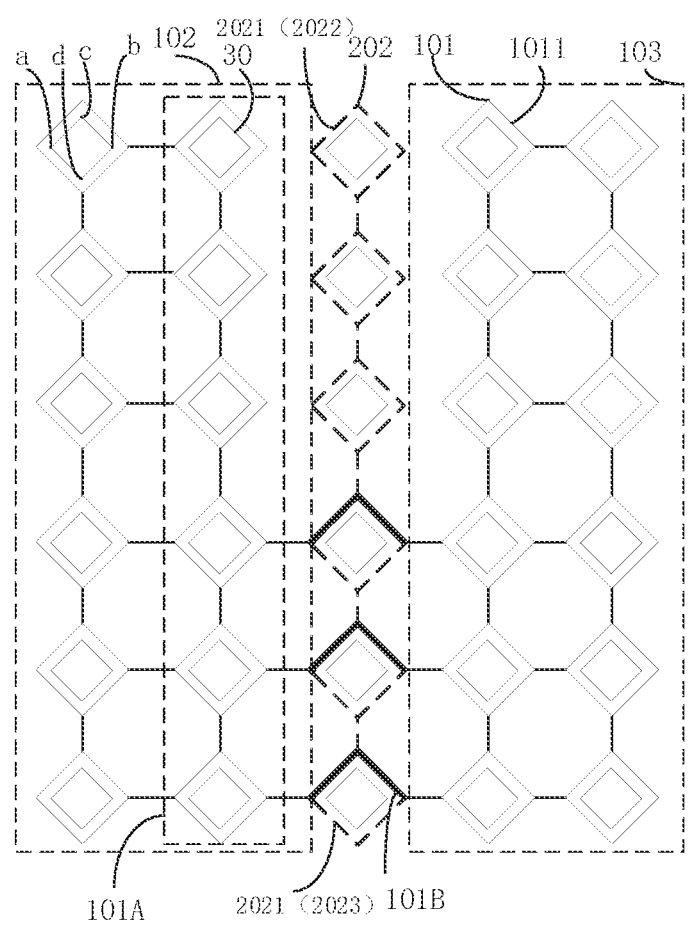
FIG. 3 is a first enlarged schematic diagram of touch units and the sub-pixels in the area A in FIG. 1.

Please refer to FIG. 3, which is a first enlarged schematic diagram of the touch units 101 and the sub-pixels 30 in the area A in FIG. 1. As shown in FIG. 3, the touch units 101 comprise a plurality of touch unit traces 1011 electrically connected to each other. The touch unit traces 1011 are arranged between the sub-pixels 30. Each of the touch units 101 comprises the touch unit traces 1011 between the sub-pixels 30. When the touch display panel 1 is pressed, the denser the distribution of the touch unit traces 1011 in each of the touch units 101, the greater the capacitance change, and the easier the touch signals are detected.

In the embodiment of the present disclosure, in the extending direction of the signal transmission lines 201, orthographic projections of the signal transmission lines 201 on the touch units 101 electrically connected to the signal transmission lines 201 overlap with the touch unit traces 1011 of the touch units 101 in a one-to-one correspondence. In the extending direction of the signal transmission lines 201, each of the signal transmission lines 201 needs to be electrically connected to the corresponding touch unit 101. Therefore, in the embodiment of the present disclosure, the orthographic projections of the signal transmission lines 201 on the touch units 101 electrically connected to the signal transmission lines 201 overlap with the touch unit traces 1011 of the touch units 101 in the one-to-one correspondence, so that the signal transmission lines 201 are better electrically connected with the touch units 101.

In the embodiment of the present disclosure, the sub-pixels 30 are arranged in an array, the touch unit traces 1011 are located between adjacent sub-pixels 30, and the signal transmission sub-lines 2011 are located between the adjacent sub-pixels 30.

As shown in FIG. 1 and FIG. 3, in the embodiment of the present disclosure, the touch electrode wiring layer 10 comprises a first projection area 100. The first projection area 100 is a projection area corresponding to an orthographic projection of the signal transmission line 201 on the touch electrode wiring layer 10. The first projection area 100 comprises at least one second projection area 202 corresponding to the touch units 101 insulated from the signal transmission lines 201. The second projection area 202 divides the touch units 101 into a first part 102 and a second part 103. Specifically, in the area A, the second projection area 202 corresponding to an orthographic projection of the signal transmission line 201 on the touch units 101 divides the touch units 101 into the first part 102 and the second part 103.

The touch units 101 further comprise a wiring area 2023 and a blank area 2022. The wiring area 2023 is provided with the touch unit traces 1011 electrically connected to the first part 102 and the second part 103. In the blank area 2022, the touch units 101 have no touch unit traces 1011.

The second projection area 202 comprises a plurality of projection sub-areas 2021 connected to each other. Each of the projection sub-areas 2021 is arranged around one of the sub-pixels 30. Each of the projection sub-areas 2021 corresponds to one of the sub-pixels 30. Some of the projection sub-areas 2021 correspond to the blank area 2022, and some of the projected sub-areas 2021 correspond to the wiring area 2023. That is, some of the projection sub-areas 2021 are not provided with the touch unit traces 1011, and some of the projection sub-areas 2021 are provided with the touch unit traces 1011 electrically connecting the first part 102 and the second part 103.

That is, in the embodiment of the present disclosure, some of the projection sub-areas 2021 are not provided with touch unit traces 1011, and some of the projection sub-areas 2021 are provided with touch unit traces 1011 electrically connecting the first part 102 and the second part 103, so that an area of the signal transmission lines 201 directly facing the touch units 101 is reduced. This prevents abnormal touch caused by a short circuit between the signal transmission lines 201 and the touch units 101 due to particles.

Specifically, each of the sub-pixels 30 comprises a first end a and a second end b arranged oppositely with respect to the row direction, and a third end c and a fourth end d arranged oppositely with respect to the column direction. In the projection sub-areas 2021 provided with the touch unit traces 1011, each of the touch units 101 comprises a first touch unit trace arranged along a direction from the first end a to the third end c. That is, in the wiring area 2023, each of the touch units 101 comprises the first touch unit trace arranged along the direction from the first end a to the third end c. In the projection sub-areas 2021 provided with the touch unit traces 1011, each of the touch units 101 further comprises a second touch unit trace arranged along a direction from the third end c to the second end b. That is, in the wiring area 2023, each of the touch units 101 further comprises the second touch unit trace arranged along the direction from the third end c to the second end b.

One end of the first touch unit trace is connected to the first part 102, the other end of the first touch unit trace is connected to one end of the second touch unit trace, and the other end of the second touch unit trace is connected to the second part 103. That is, in some of the projection sub-areas 2021, each of the touch units 101 is only provided with the first touch unit trace and the second touch unit trace.

It should be understood that the touch units 101 comprise a plurality of touch unit lines 101A arranged in a first direction. The touch unit lines 101A are electrically connected through touch connection lines 101B. Each of the signal transmission lines 201 is disposed between two adjacent touch unit lines 101A, and partially overlaps the touch connection line 101B between the two adjacent touch unit lines 101A.

The touch display panel 1 comprises the sub-pixels 30 arranged in the array. Each of the signal transmission lines 201 comprises the signal transmission sub-lines 2011 that are electrically connected, and each of the signal transmission sub-lines 2011 is arranged around one of the sub-pixels 30.

Each of the sub-pixels 30 comprises the first end a and the second end b arranged oppositely with respect to the first direction, and the third end c and the fourth end d arranged oppositely with respect to a second direction. Each of the touch connection lines 101B comprises a first touch connection sub-line arranged along the direction from the first end a to the third end c, and a second touch connection sub-line arranged along the direction from the third end c to the second end b. One end of the first touch connection sub-line is connected to the touch unit line 101A disposed on one side of the touch connection line 101B. The other end of the first touch connection sub-line is connected to one end of the second touch connection sub-line. The other end of the second touch connection sub-line is connected to the touch unit line 101A disposed on the other side of the touch connection line 101B.

Figure 4:
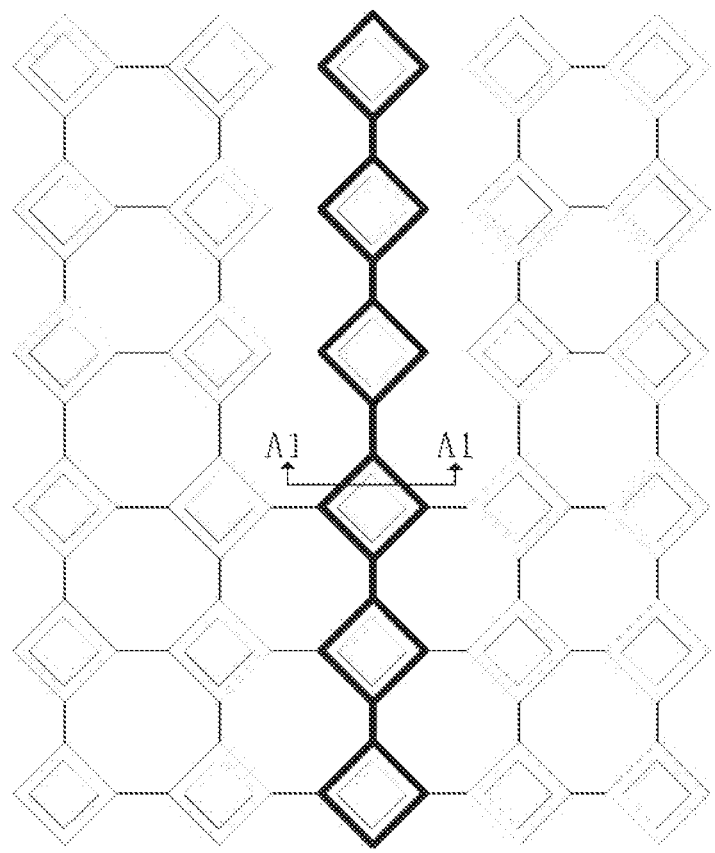
FIG. 4 is an enlarged schematic diagram of the signal transmission lines, the touch units, and the sub-pixels in the area A in FIG. 1.
Figure 5:
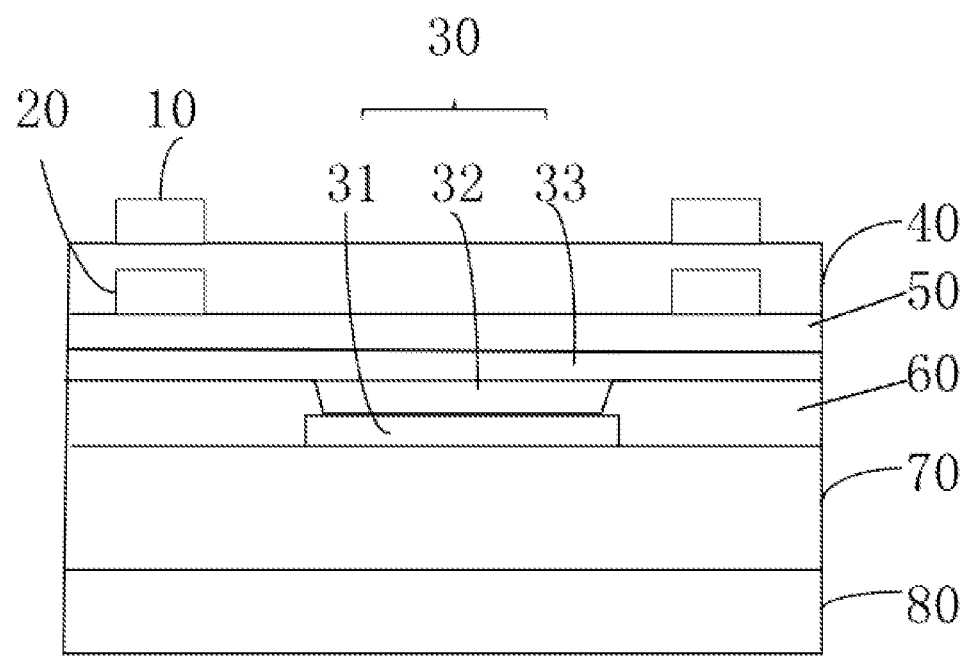
FIG. 5 is a cross-sectional view along a line A1-A1 in FIG. 4.

Furthermore, please refer to FIG. 4 an FIG. 5. FIG. 4 is an enlarged schematic diagram of the signal transmission lines 201, the touch units 101, and the sub-pixels 30 in the area A in FIG. 1. FIG. 5 is a cross-sectional view along line A1-A1 in FIG. 4. As shown in FIG. 4 and FIG. 5, the touch display panel 1 comprises a substrate 80. The substrate 80 may be a flexible substrate or a rigid substrate. The flexible substrate may be made of polyimide. The rigid substrate may be made of glass.

A planarization layer 70 is disposed on the substrate 80. A side of the planarization layer 70 away from the substrate 80 is provided with a plurality of first electrodes 31. A pixel defining layer 60 is disposed on the first electrodes 31 and the planarization layer 70. The pixel defining layer 60 is provided with a plurality of openings exposing the first electrodes 31. A plurality of light-emitting blocks 32 are disposed in the openings. A second electrode 33 is disposed on the light-emitting blocks 32 and the pixel defining layer 60. The first electrodes 31, the light-emitting blocks 32, and the second electrode 33 form the sub-pixels 30. The sub-pixels 30 are arranged in the array.

The light-emitting blocks 32 may comprise red, green, and blue light-emitting blocks, or may comprise red, green, blue, and white light-emitting blocks. The sub-pixels 30 of three primary colors of red, green, and blue or four primary colors of red, green, blue, and white are alternately arranged. The light-emitting blocks 32 may be made of an organic light-emitting material.

The first electrodes 31 may be anodes, and may be made of a light-transmitting material or a light-reflecting material. The light-transmitting material may comprise at least one of indium tin oxide (ITO), indium zinc oxide (IZO), and indium gallium zinc oxide (IGZO). The light-reflecting material may be silver (Ag), a silver alloy, aluminum (Al), or an aluminum alloy. For example, silver (Ag), an alloy of silver and lead (Ag:Pb), an alloy of aluminum and neodymium (Al:Nd), or an alloy of silver, platinum, and copper (Ag:Pt:Cu).

The second electrode 33 may be a cathode, and may be made of a material (a transflective material) that is partially transparent and partially reflective or a light-reflecting material. The transflective material may comprise at least one of magnesium, silver, and aluminum. For example, a mixture of magnesium and silver, or a mixture of aluminum and silver. The light-transmitting material may comprise at least one of indium tin oxide (ITO), indium zinc oxide (IZO), and indium gallium zinc oxide (IGZO). In other words, the touch display panel 1 may have a top-emitting structure or a bottom-emitting structure, which is not limited in this embodiment.

The second electrode 33 of each of the sub-pixel 30 may be connected as a surface electrode to facilitate power supply of the second electrode 33.

In some embodiments, a light emitting mode of the sub-pixels 30 may be active matrix (AM). A pixel driving circuit controls light emission of the sub-pixels 30. Therefore, the pixel driving circuit may be disposed between the first electrodes 31 and the substrate 80. The pixel driving circuit may comprise a plurality of transistors and a plurality of storage capacitors, and a drain electrode of one of the transistors is electrically connected to one of the first electrodes 31. For example, a pixel driving circuit with a 2T1C structure comprises a switching transistor, a driving transistor, and a storage capacitor.

A gate electrode of the switching transistor is electrically connected to one of the scan signal lines. When a scan signal is a turn-on voltage, the switch transistor keeps a data signal of one of the data signal lines in a plate electrode of the storage capacitor. When the scan signal is a turn-off voltage, the data signal kept in the storage capacitor keeps the driving transistor on, so that a power signal in a power signal line continuously supplies power to the first electrode 31 of the sub-pixel 30.

A side of the second electrode 33 away from the substrate 80 may be provided with an encapsulation layer 50. For example, the encapsulation layer 50 may be a thin film encapsulation (TFE) layer. The encapsulation layer 50 may comprise a plurality of organic encapsulation layers and a plurality of inorganic encapsulation layers that are alternately stacked.

A side of the encapsulation layer 50 away from the substrate 80 is provided with a touch electrode wiring layer 10. A touch layer of a self-capacitive structure may comprise the touch electrode wiring layer 10 and a signal transmission wiring layer 20. The touch electrode wiring layer 10 and the signal transmission wiring layer 20 are located in different layers, and are insulated from each other by an insulating layer 40.

It should be noted that, in the embodiment shown in FIG. 5, the touch electrode wiring layer 10 is close to the substrate 80, and the signal transmission wiring layer 20 is far away from the substrate 80. In some embodiments, the signal transmission wiring layer 20 may be close to the substrate 80, and the touch electrode wiring layer 10 may be far away from the substrate 80.

In the embodiment of the present disclosure, the touch electrode wiring layer 10 and the signal transmission wiring layer 20 are made of an opaque metal, such as molybdenum. Therefore, the touch electrode wiring layer 10 and the signal transmission wiring layer 20 are disposed between the sub-pixels 30. In some embodiments, the touch electrode wiring layer 10 and the signal transmission wiring layer 20 may also be made of a light-transmitting conductive material, such as at least one of indium tin oxide (ITO), indium zinc oxide (IZO), and indium gallium zinc oxide (IGZO).

Figure 6:
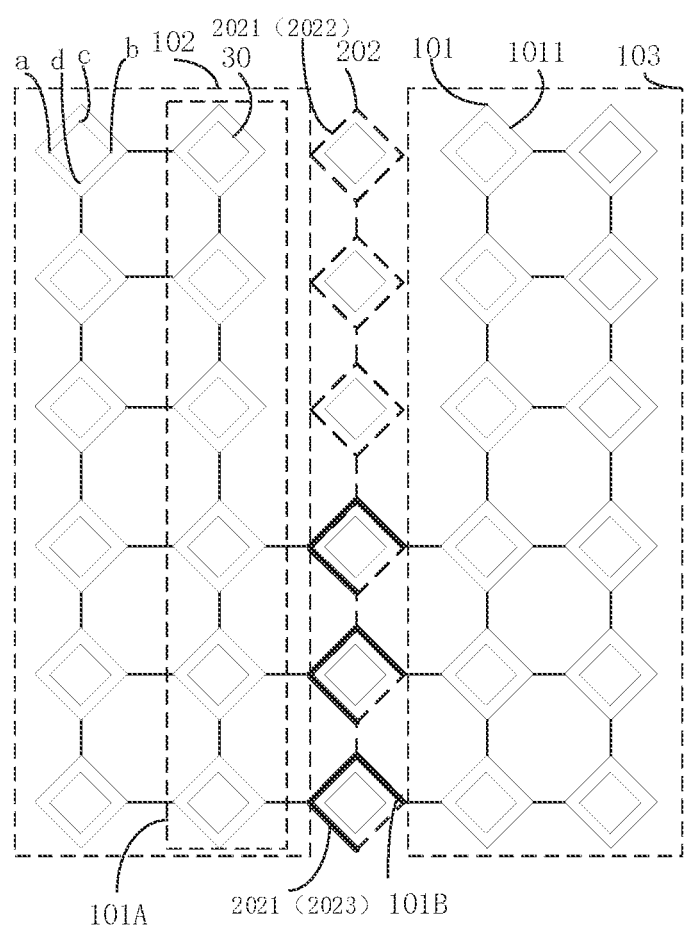
FIG. 6 is a second enlarged schematic diagram of the touch units and the sub-pixels in the area A in FIG. 1.

In an embodiment, please refer to FIG. 6, which is a second enlarged schematic diagram of the touch units 101 and the sub-pixels 30 in the area A in FIG. 1. The enlarged schematic diagram of FIG. 6 is different from the enlarged schematic diagram of FIG. 3 in that in the projection sub-areas 2021 provided with the touch unit traces 1011, each of the touch units 101 further comprises a third touch unit trace arranged along a direction from the first end a to the fourth end d. That is, in the wiring area 2023, each of the touch units 101 further comprises the third touch unit trace arranged along the direction from the first end a to the fourth end d.

It should be understood that each of the touch connection lines 101B further comprises a third touch connection sub-line arranged along the direction from the first end a to the fourth end d.

Figure 7:
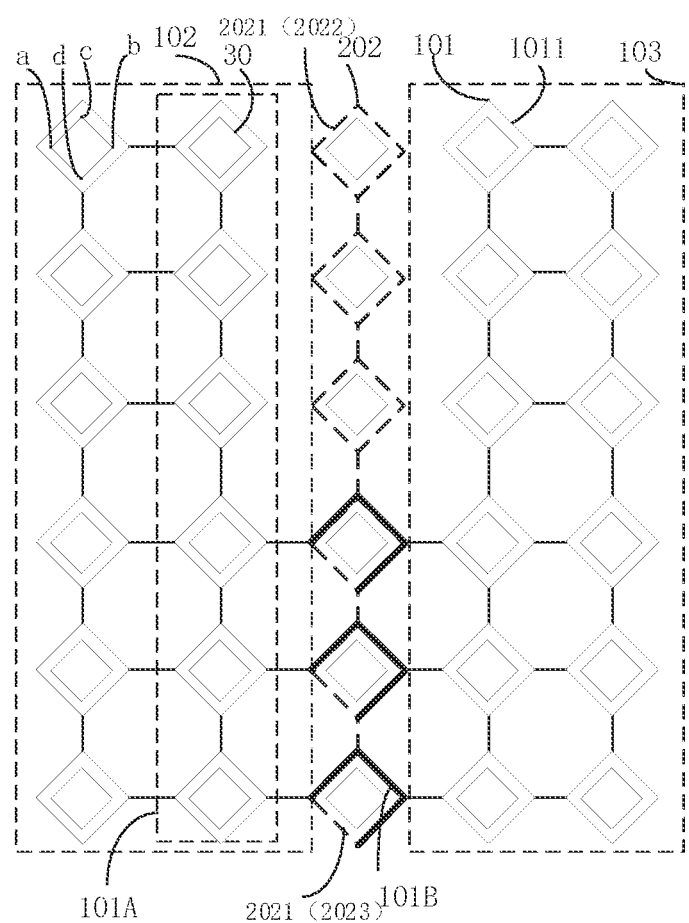
FIG. 7 is a third enlarged schematic diagram of the touch units and sub-pixels in the area A in FIG. 1.

In an embodiment, please refer to FIG. 7, which is a third enlarged schematic diagram of the touch units 101 and the sub-pixels 30 in the area A in FIG. 1. The enlarged schematic diagram of FIG. 7 is different from the enlarged schematic diagram of FIG. 3 in that in the projection sub-areas 2021 provided with the touch unit traces 1011, each of the touch units 101 further comprises a fourth touch unit trace arranged along a direction from the fourth end d to the second end b. That is, in the wiring area 2023, each of the touch units 101 further comprises the fourth touch unit trace arranged along the direction from the fourth end d to the second end b.

It should be understood that each of the touch connection lines 101B further comprises a fourth touch connection sub-line arranged along the direction from the fourth end d to the second end b.

Figure 8:
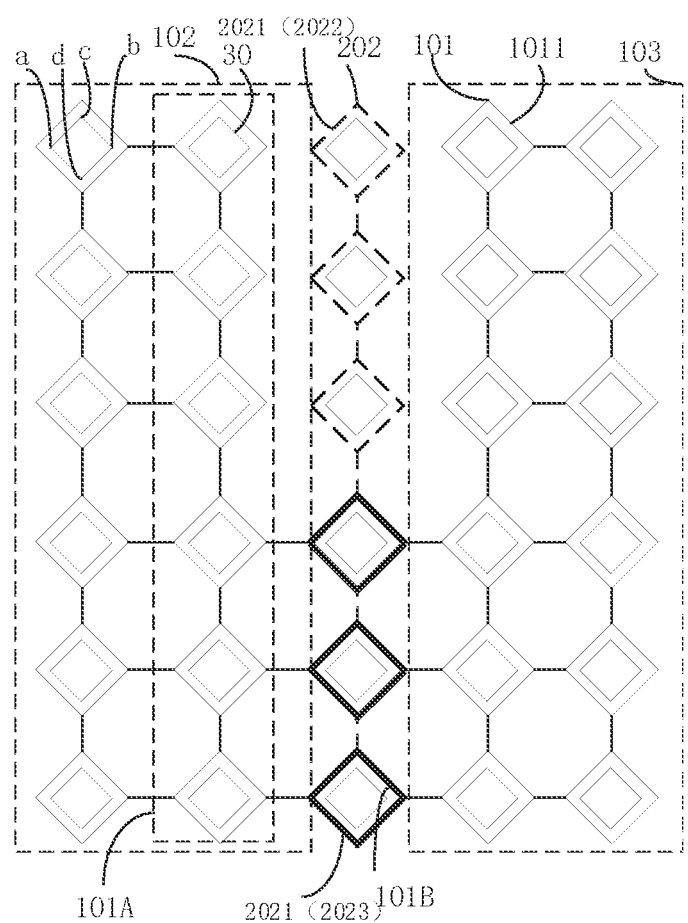
FIG. 8 is a fourth enlarged schematic diagram of the touch units and sub-pixels in the area A in FIG. 1.

In an embodiment, please refer to FIG. 8, which is a fourth enlarged schematic diagram of the touch units 101 and the sub-pixels 30 in the area A in FIG. 1. The enlarged schematic diagram of FIG. 8 is different from the enlarged schematic diagram of FIG. 3 in that in the projection sub-areas 2021 provided with the touch unit traces 1011, each of the touch units 101 further comprises the third touch unit trace arranged along a direction from the first end a to the fourth end d, and the fourth touch unit trace arranged along a direction from the fourth end d to the second end b. That is, in the wiring area 2023, each of the touch units 101 further comprises the third touch unit trace arranged along the direction from the first end a to the fourth end d, and the fourth touch unit trace arranged along the direction from the fourth end d to the second end b.

It should be understood that each of the touch connection lines 101B further comprises the third touch connection sub-line arranged along the direction from the first end a to the fourth end d, and the fourth touch connection sub-line arranged along the direction from the fourth end d to the second end b.

Figure 9:
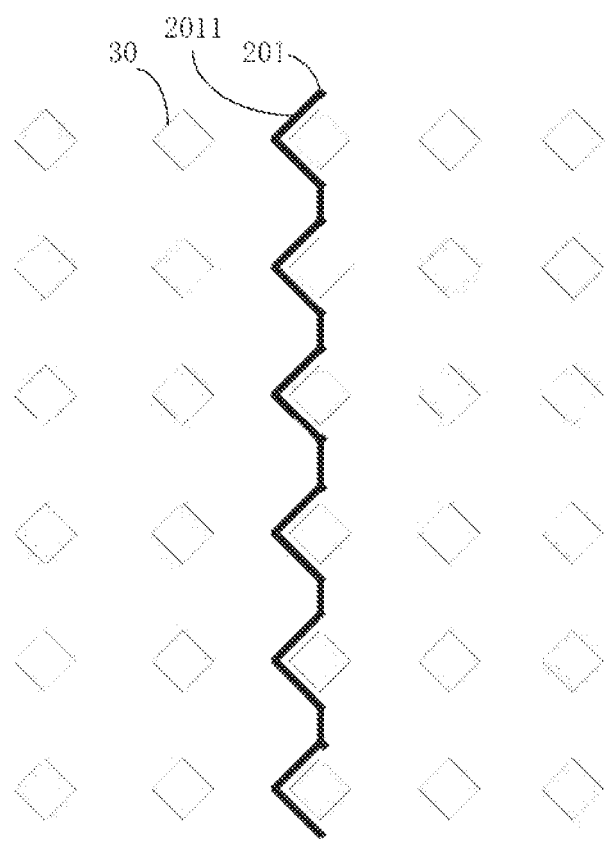
FIG. 9 is the other enlarged schematic diagram of the signal transmission lines and the sub-pixels in the area A in FIG. 1.
Figure 10:
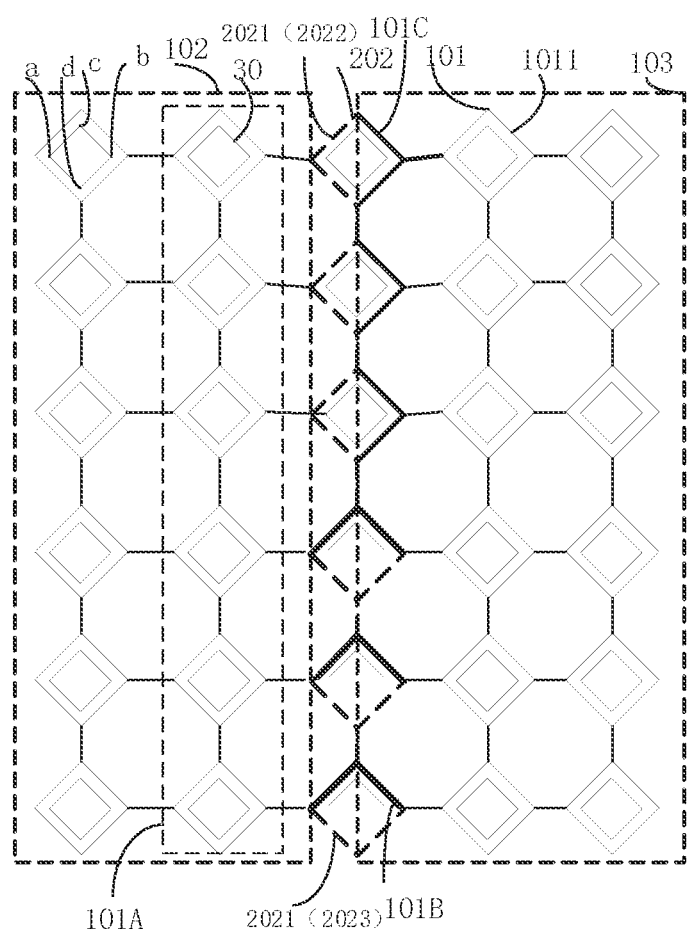
FIG. 10 is a fifth enlarged schematic diagram of the touch units and sub-pixels in the area A in FIG. 1.

Please refer to FIG. 9 and FIG. 10. FIG. 9 is the other enlarged schematic diagram of the signal transmission lines 201 and the sub-pixels 30 in the area A in FIG. 1. FIG. 10 is a fifth enlarged schematic diagram of the touch units 101 and the sub-pixels 30 in the area A in FIG. 1. It should be noted that the touch display panel 1 provided by the embodiment of the present disclosure has the areas that are the same as the area A, such as the area B and the area C shown in FIG. 1, which will not be described in detail herein As shown in FIG. 9, the signal transmission lines 201 comprise the signal transmission sub-lines 2011 that are electrically connected to each other. The signal transmission sub-lines 2011 are arranged as broken lines. The signal transmission sub-lines 2011 are arranged between the sub-pixels 30. Each of the signal transmission lines 201 comprises the signal transmission sub-lines 2011 between the sub-pixels 30. That is, each of the signal transmission sub-lines 2011 is partially arranged around one of the sub-pixels 30.

As shown in FIG. 10, the touch units 101 comprise the touch unit traces 1011 electrically connected to each other. The touch unit traces 1011 are arranged between the sub-pixels 30. Each of the touch units 101 comprises the touch unit traces 1011 between the sub-pixels 30. When the touch display panel 1 is pressed, the denser the distribution of the touch unit traces 1011 in each of the touch units 101, the greater the capacitance change, and the easier the touch signals are detected.

As shown in FIG. 1, FIG. 9, and FIG. 10, in the embodiment of the present disclosure, the touch electrode wiring layer 10 comprises the first projection area 100. The first projection area 100 is the projection area corresponding to the orthographic projection of the signal transmission line 201 on the touch electrode wiring layer 10. The first projection area 100 comprises at least one second projection area 202 corresponding to the touch units 101 insulated from the signal transmission lines 201. The second projection area 202 divides the touch units 101 into line the first part 102 and the second part 103. Specifically, in the area A, the second projection area 202 corresponding to the orthographic projection of the signal transmission line 201 on the touch units 101 divides the touch units 101 into the first part 102 and the second part 103.

The touch units 101 further comprise a wiring area 2023 and a blank area 2022. The wiring area 2023 is provided with the touch unit traces 1011 electrically connected to the first part 102 and the second part 103. In the blank area 2022, the touch units 101 have no touch unit traces 1011.

The second projection area 202 comprises a plurality of projection sub-areas 2021 connected to each other. Each of the projection sub-areas 2021 is arranged around a half of one of the sub-pixels 30. Each of the projection sub-areas 2021 corresponds to one of the sub-pixels 30. Some of the projection sub-areas 2021 correspond to the blank area 2022, and some of the projected sub-areas 2021 correspond to the wiring area 2023. That is, some of the projection sub-areas 2021 are not provided with the touch unit traces 1011, and some of the projection sub-areas 2021 are provided with the touch unit traces 1011 electrically connecting the first part 102 and the second part 103.

That is, in the embodiment of the present disclosure, some of the projection sub-areas 2021 are not provided with touch unit traces 1011, and some of the projection sub-areas 2021 are provided with touch unit traces 1011 electrically connecting the first part 102 and the second part 103, so that an area of the signal transmission lines 201 directly facing the touch units 101 is reduced. This prevents abnormal touch caused by a short circuit between the signal transmission lines 201 and the touch units 101 due to particles.

Specifically, each of the sub-pixels 30 comprises a first end a and a second end b arranged oppositely with respect to the row direction, and a third end c and a fourth end d arranged oppositely with respect to the column direction. In the projection sub-areas 2021 provided with the touch unit traces 1011, each of the touch units 101 comprises a first touch unit trace arranged along a direction from the first end a to the third end c. That is, in the wiring area 2023, each of the touch units 101 comprises the first touch unit trace arranged along the direction from the first end a to the third end c.

One end of the first touch unit trace is connected to the first part 102, and the other end of the first touch unit trace is connected to the second part 103. That is, in some of the projection sub-areas 2021, each of the touch units 101 is only provided with the first touch unit trace.

It should be understood that the touch units 101 comprise a plurality of touch unit lines 101A arranged in a first direction. The touch unit lines 101A are electrically connected through touch connection lines 101B. Each of the signal transmission lines 201 is disposed between two adjacent touch unit lines 101A, and partially overlaps the touch connection line 101B between the two adjacent touch unit lines 101A.

The touch display panel 1 comprises the sub-pixels 30 arranged in the array. Each of the signal transmission lines 201 comprises the signal transmission sub-lines 2011 that are electrically connected, and each of the signal transmission sub-lines 2011 is partially arranged around one of the sub-pixels 30.

Each of the sub-pixels 30 comprises the first end a and the second end b arranged oppositely with respect to the first direction, and the third end c and the fourth end d arranged oppositely with respect to a second direction. Each of the touch connection lines 101B comprises a first touch connection sub-line arranged along the direction from the first end a to the third end c, and a second touch connection sub-line arranged along the direction from the third end c to the second end b. One end of the first touch connection sub-line is connected to the touch unit line 101A disposed on one side of the touch connection line 101B. The other end of the first touch connection sub-line is connected to one end of the second touch connection sub-line. The other end of the second touch connection sub-line is connected to the touch unit line 101A disposed on the other side of the touch connection line 101B. The touch connection lines 101B partially overlap with the signal transmission sub-lines 2011.

The touch units 101 further comprise a plurality of dummy sub-lines 101C arranged between adjacent touch unit lines 101A. One end of each of the dummy sub-lines 101C is electrically connected to one of the touch unit lines 101A, the other end of each of the dummy sub-lines 101C is disposed close to one of the signal transmission lines 201. The dummy sub-lines 101C do not overlap with the signal transmission lines 201.

Each of the signal transmission sub-lines 2011 comprises a first signal transmission sub-line arranged along the direction from the first end a to the third end c, and a second signal transmission sub-line arranged along the direction from the first end a to the fourth end d. Each of the dummy sub-lines 101C comprises a first dummy sub-line arranged along a direction from the second end b to the third end c, and a second dummy sub-line arranged along a direction from the second end b to the fourth end d.

Figure 11:
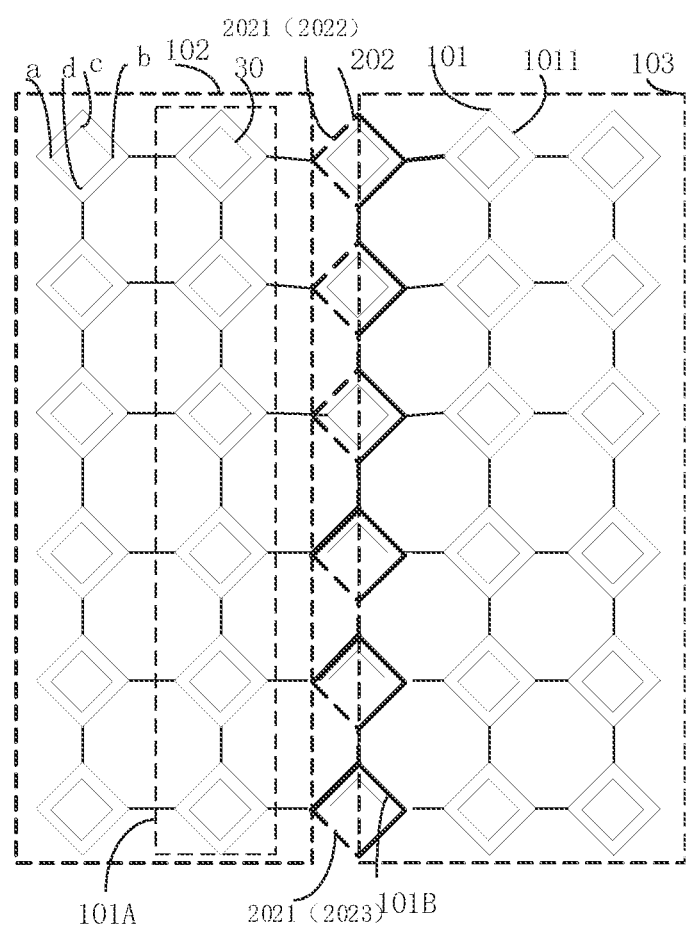
FIG. 11 is a sixth enlarged schematic diagram of the touch units and sub-pixels in the area A in FIG. 1.

In an embodiment, please refer to FIG. 11, which is a sixth enlarged schematic diagram of the touch units 101 and the sub-pixels 30 in the area A in FIG. 1. The enlarged schematic diagram of FIG. 11 is different from the enlarged schematic diagram of FIG. 10 in that in the projection sub-areas 2021 provided with the touch unit traces 1011, each of the touch units 101 further comprises a third touch unit trace arranged along a direction from the first end a to the fourth end d. That is, in the wiring area 2023, each of the touch units 101 further comprises the third touch unit trace arranged along the direction from the first end a to the fourth end d.

It should be understood that each of the signal transmission sub-lines 2011 comprises the first signal transmission sub-line arranged along the direction from the first end a to the third end c, and the second signal transmission sub-line arranged along the direction from the first end a to the fourth end d. Each of the touch connection lines 101B further comprises the third touch connection sub-line arranged along the direction from the first end a to the fourth end d, and the fourth touch connection sub-line arranged along the direction from the fourth end d to the second end b. That is, the embodiment of the present disclosure makes full use of a wiring space, thereby improving a touch effect.

An embodiment of the present disclosure further provides a touch display device, which comprises the touch display panel described in any of the above embodiments. For details, please refer to the above description, which will not be described herein.

The touch display panel and the touch display device provided by the present disclosure are described in detail above. The present disclosure uses specific examples to describe principles and embodiments of the present invention. The above description of the embodiments is only for helping to understand solutions of the present invention and their core ideas. Furthermore, those skilled in the art may make modifications to the specific embodiments and applications according to the ideas of the present invention. In conclusion, the present specification should not be construed as a limitation to the present invention.

What is claimed is:

1. A touch display panel comprising a plurality of sub-pixels arranged in an array, the touch display panel comprising:
   a signal transmission wiring layer comprising a plurality of signal transmission lines arranged in a first direction, wherein each of the signal transmission lines extends in a second direction; and
   a touch electrode wiring layer disposed on a side of the signal transmission wiring layer and comprising a plurality of touch units arranged in an array, the touch units comprise a plurality of touch unit lines arranged in the first direction, and each of the touch unit lines comprises touch unit traces surrounding each of the sub-pixels;
   wherein a portion of each of the touch units which is directly opposite to a corresponding one of the signal transmission lines comprises a wiring area provided with touch connection lines, and a blank area; each of ones of the sub-pixels which are located in the blank area is not surrounded by the touch unit traces; the corresponding signal transmission line is disposed between two adjacent of the touch unit lines which are electrically connected by the touch connection lines; an orthographic projection of a portion of the corresponding signal transmission line corresponding to the wiring area on the touch electrode wiring layer partially overlaps the touch connection lines.

2. The touch display panel according to claim 1, wherein each of the signal transmission lines comprises a plurality of signal transmission sub-lines that are electrically connected to each other, and each of the signal transmission sub-lines is arranged around one of the sub-pixels.

3. The touch display panel according to claim 2, wherein each of the sub-pixels comprises a first end and a second end arranged oppositely with respect to the first direction, and a third end and a fourth end arranged oppositely with respect to the second direction;
   each of the touch connection lines comprises a first touch connection sub-line arranged along a direction from the first end to the third end, and a second touch connection sub-line arranged along a direction from the third end to the second end;
   one end of the first touch connection sub-line is connected to the touch unit line disposed on one side of the touch connection line;
   the other end of the first touch connection sub-line is connected to one end of the second touch connection sub-line; and
   the other end of the second touch connection sub-line is connected to the touch unit line disposed on the other side of the touch connection line.

4. The touch display panel according to claim 3, wherein each of the touch connection lines further comprises a third touch connection sub-line arranged along a direction from the first end to the fourth end.

5. The touch display panel according to claim 3, wherein each of the touch connection lines further comprises a fourth touch connection sub-line arranged along a direction from the fourth end to the second end.

6. The touch display panel according to claim 3, wherein each of the touch connection lines further comprises a third touch connection sub-line arranged along a direction from the first end to the fourth end, and a fourth touch connection sub-line arranged along a direction from the fourth end to the second end.

7. The touch display panel according to claim 1, wherein each of the signal transmission lines comprises a plurality of signal transmission sub-lines that are electrically connected to each other, and each of the signal transmission sub-lines is partially arranged around one of the sub-pixels.

8. The touch display panel according to claim 7, wherein each of the sub-pixels comprises a first end and a second end arranged oppositely with respect to the first direction, and a third end and a fourth end arranged oppositely with respect to the second direction;
   each of the touch connection lines comprises a first touch connection sub-line arranged along a direction from the first end to the third end, and a second touch connection sub-line arranged along a direction from the third end to the second end;
   one end of the first touch connection sub-line is connected to the touch unit line disposed on one side of the touch connection line;
   the other end of the first touch connection sub-line is connected to one end of the second touch connection sub-line;
   the other end of the second touch connection sub-line is connected to the touch unit line disposed on the other side of the touch connection line; and
   the touch connection lines partially overlap with the signal transmission sub-lines.

9. The touch display panel according to claim 8, wherein each of the signal transmission sub-lines comprises a first signal transmission sub-line arranged along the direction from the first end to the third end, and a second signal transmission sub-line arranged along a direction from the first end to the fourth end; and
   each of the touch connection lines further comprises a fourth touch connection sub-line arranged along a direction from the fourth end to the second end.

10. The touch display panel according to claim 7, wherein the touch units further comprise a plurality of dummy sub-lines arranged between adjacent touch unit lines, one end of each of the dummy sub-lines is electrically connected to one of the touch unit lines, the other end of each of the dummy sub-lines is disposed close to one of the signal transmission lines, and the dummy sub-lines do not overlap with the signal transmission lines.

11. The touch display panel according to claim 10, wherein
    each of the sub-pixels comprises a first end and a second end arranged oppositely with respect to the first direction, and a third end and a fourth end arranged oppositely with respect to the second direction;
    each of the signal transmission sub-lines comprises a first signal transmission sub-line arranged along a direction from the first end to the third end, and a second signal transmission sub-line arranged along a direction from the first end to the fourth end; and
    each of the dummy sub-lines comprises a first dummy sub-line arranged along a direction from the second end to the third end, and a second dummy sub-line arranged along a direction from the second end to the fourth end.

12. A touch display panel comprising a plurality of sub-pixels arranged in an array, the touch display panel comprising:

a signal transmission wiring layer comprising a plurality of signal transmission lines arranged in a first direction, wherein each of the signal transmission lines extends in a second direction; and a touch electrode wiring layer disposed on a side of the signal transmission wiring layer and comprising a plurality of touch units arranged in an array, the touch units comprise a plurality of touch unit lines arranged in the first direction, and each of the touch unit lines comprises touch unit traces surrounding each of the sub-pixels;

wherein a portion of each of the touch units which is directly opposite to a corresponding one of the signal transmission lines comprises a wiring area provided with touch connection lines, and a blank area; each of ones of the sub-pixels which are located in the blank area is not surrounded by the touch unit traces; the corresponding signal transmission line is disposed between two adjacent of the touch unit lines which are electrically connected by the touch connection lines; an orthographic projection of a portion of the corresponding signal transmission line corresponding to the wiring area on the touch electrode wiring layer partially overlaps the touch connection lines, and in the second direction, each of the signal transmission lines is electrically connected to one of the touch units and is insulated from the other touch units.

13. The touch display panel according to claim 12, wherein each of the signal transmission lines comprises a plurality of signal transmission sub-lines that are electrically connected to each other, and each of the signal transmission sub-lines is arranged around one of the sub-pixels.

14. The touch display panel according to claim 13, wherein
each of the sub-pixels comprises a first end and a second end arranged oppositely with respect to the first direction, and a third end and a fourth end arranged oppositely with respect to the second direction;
each of the touch connection lines comprises a first touch connection sub-line arranged along a direction from the first end to the third end, and a second touch connection sub-line arranged along a direction from the third end to the second end;
one end of the first touch connection sub-line is connected to the touch unit line disposed on one side of the touch connection line;
the other end of the first touch connection sub-line is connected to one end of the second touch connection sub-line; and
the other end of the second touch connection sub-line is connected to the touch unit line disposed on the other side of the touch connection line.

15. The touch display panel according to claim 14, wherein each of the touch connection lines further comprises a third touch connection sub-line arranged along a direction from the first end to the fourth end.

16. The touch display panel according to claim 12, wherein each of the signal transmission lines comprises a plurality of signal transmission sub-lines that are electrically connected to each other, and each of the signal transmission sub-lines is partially arranged around one of the sub-pixels.

17. The touch display panel according to claim 16, wherein
each of the sub-pixels comprises a first end and a second end arranged oppositely with respect to the first direction, and a third end and a fourth end arranged oppositely with respect to the second direction;
each of the touch connection lines comprises a first touch connection sub-line arranged along a direction from the first end to the third end, and a second touch connection sub-line arranged along a direction from the third end to the second end;
one end of the first touch connection sub-line is connected to the touch unit line disposed on one side of the touch connection line;
the other end of the first touch connection sub-line is connected to one end of the second touch connection sub-line;
the other end of the second touch connection sub-line is connected to the touch unit line disposed on the other side of the touch connection line; and
the touch connection lines partially overlap with the signal transmission sub-lines.

18. The touch display panel according to claim 17, wherein
each of the signal transmission sub-lines comprises a first signal transmission sub-line arranged along the direction from the first end to the third end, and a second signal transmission sub-line arranged along a direction from the first end to the fourth end;
each of the touch connection lines further comprises a fourth touch connection sub-line arranged along a direction from the fourth end to the second end;
each of the signal transmission sub-lines comprises a first signal transmission sub-line arranged along the direction from the first end to the third end, and a second signal transmission sub-line arranged along a direction from the first end to the fourth end; and
each of the dummy sub-lines comprises a first dummy sub-line arranged along a direction from the second end to the third end, and a second dummy sub-line arranged along a direction from the second end to the fourth end.

* * * * *